United States Patent
Wu et al.

(10) Patent No.: US 7,992,518 B2
(45) Date of Patent: Aug. 9, 2011

(54) SILICON CARBIDE GAS DISTRIBUTION PLATE AND RF ELECTRODE FOR PLASMA ETCH CHAMBER

(75) Inventors: Robert Wu, San Diego, CA (US); Tuqiang Ni, Pleasanton, CA (US)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 1117 days.

(21) Appl. No.: 11/689,318

(22) Filed: Mar. 21, 2007

(65) Prior Publication Data
US 2008/0202688 A1    Aug. 28, 2008

(30) Foreign Application Priority Data

Feb. 27, 2007  (CN) .......................... 2007 1 0037701

(51) Int. Cl.
C23C 16/50 (2006.01)
C23F 1/00 (2006.01)
H01L 21/306 (2006.01)
(52) U.S. Cl. .......... 118/723 E; 156/345.33; 156/345.34; 156/345.43; 156/345.45
(58) Field of Classification Search ............... 118/723 E; 156/345.43, 345.45, 345.33, 345.34
See application file for complete search history.

(56) References Cited

U.S. PATENT DOCUMENTS

| | | | | |
|---|---|---|---|---|
| 3,175,177 A | * | 3/1965 | Gaugler | 338/28 |
| 5,074,456 A | * | 12/1991 | Degner et al. | 228/121 |
| 5,162,133 A | * | 11/1992 | Bartha et al. | 427/577 |
| 5,604,151 A | * | 2/1997 | Goela et al. | 427/162 |
| 5,904,778 A | | 5/1999 | Lu et al. | |
| 6,454,860 B2 | * | 9/2002 | Metzner et al. | 118/715 |
| 6,890,861 B1 | * | 5/2005 | Bosch | 438/706 |

FOREIGN PATENT DOCUMENTS

JP    09181048 A    *    7/1997

OTHER PUBLICATIONS

Gupta, A et al. CVD Growth and Characterization of 3C-SiC Thin Films, Bull. Mater. Sci., vol. 27, No. 5, Oct. 2004, pp. 445-451. Indian Academy of Sciences.

* cited by examiner

Primary Examiner — Rudy Zervigon
(74) Attorney, Agent, or Firm — Nixon Peabody LLP; Joseph Bach, Esq.

(57) ABSTRACT

A showerhead for use in a capacitively-coupled plasma chamber and made of low resistivity bulk layer coated with CVD SiC. The bulk low resistivity material may be, for example, graphite, Silicon Carbide (SiC), converted graphite, SiC+C, etc. Sintered SiC may be used as the bulk material coated with CVD SiC to provide a showerhead that is suitable for use in a capacitively-coupled plasma chamber.

11 Claims, 3 Drawing Sheets

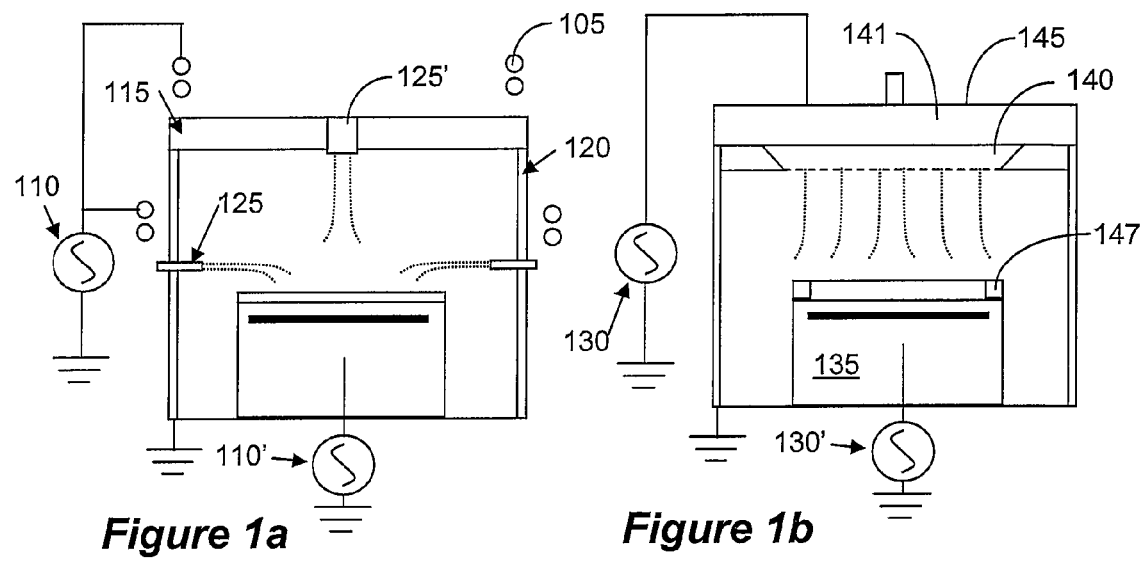
*Figure 1a*  *Figure 1b*
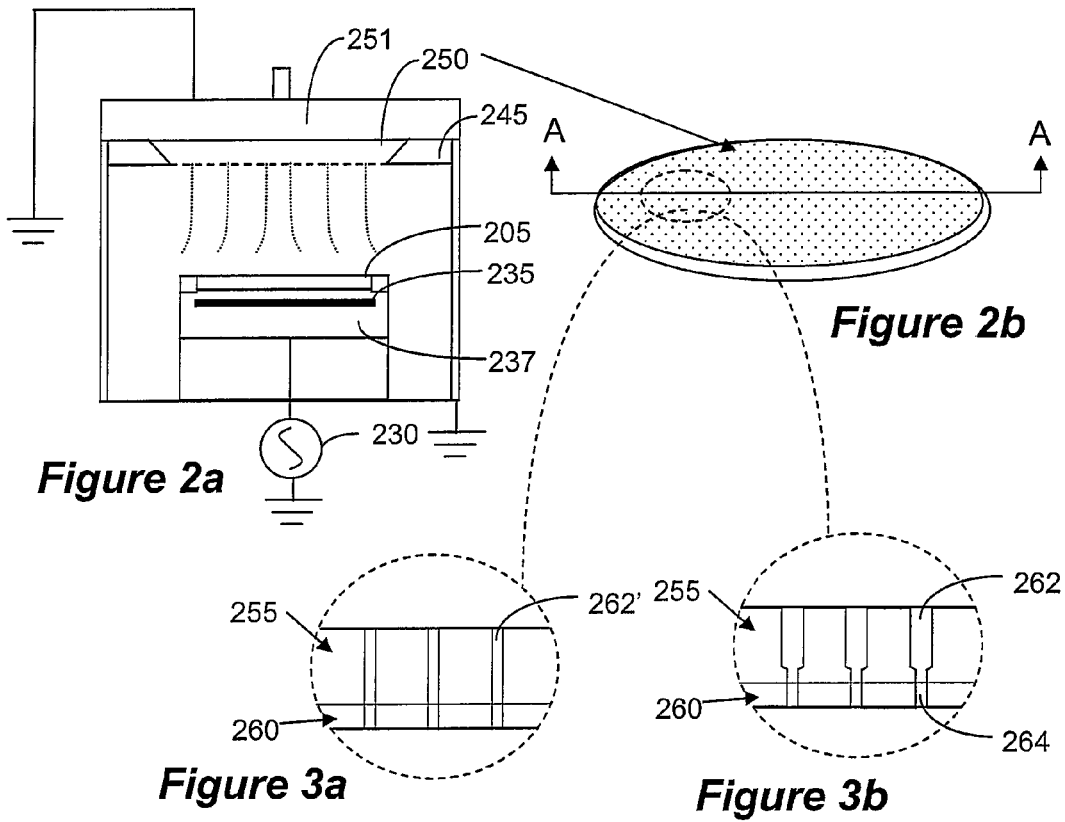
*Figure 2a*  *Figure 2b*
*Figure 3a*  *Figure 3b*

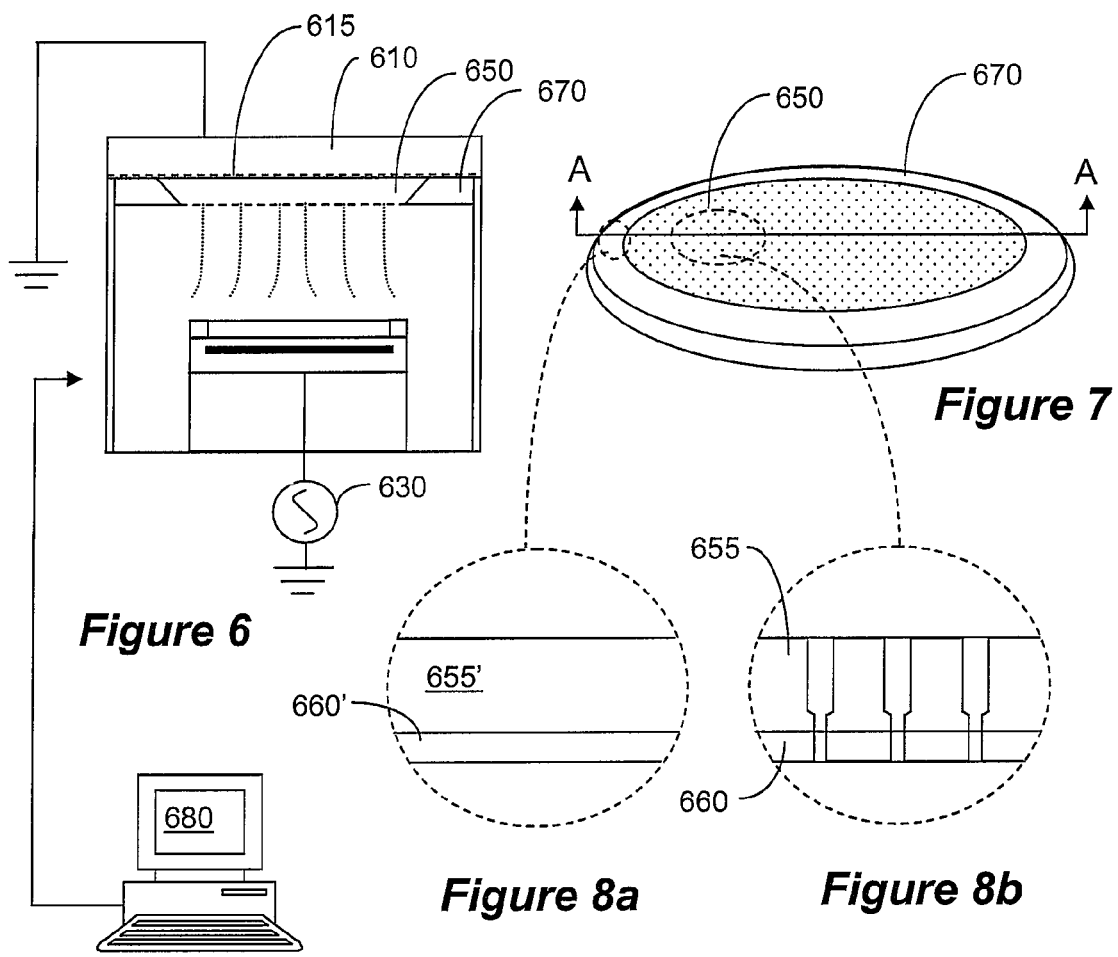
Figure 6
Figure 7
Figure 8a   Figure 8b
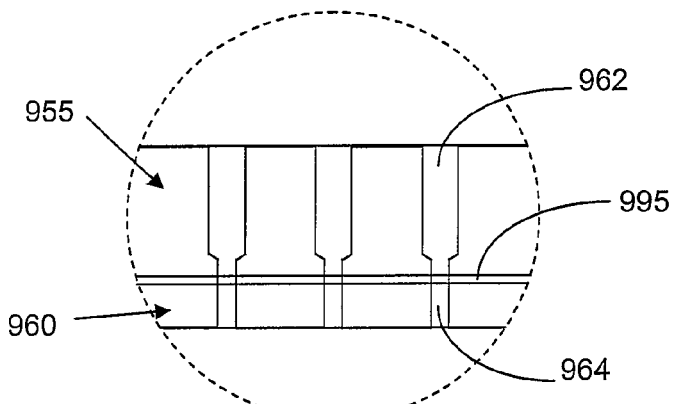
Figure 9

US 7,992,518 B2

SILICON CARBIDE GAS DISTRIBUTION PLATE AND RF ELECTRODE FOR PLASMA ETCH CHAMBER

BACKGROUND

1. Field of the Invention

The subject invention relates to plasma chambers and, more specifically, to the construction of a SiC (silicon-carbide) gas distribution plate, typically named "showerhead" and electrode (RF active or grounded) in plasma etch chamber.

2. Related Art

Plasma chambers are used, for example, in semiconductor fabrication process for etching and deposition of various layers of a specimen, such as a semiconductor wafer. To generate plasma in such chambers, the interior of the chamber is evacuated, precursor gases are injected into the chamber, and RF energy is coupled into the interior of the chamber to generate the plasma. In general there are two types of etch plasma chambers: inductive-coupled and capacitive-coupled plasma chambers. In inductive-coupled plasma chamber the RF energy is coupled into the plasma largely inductively for plasma generation; while in capacitive-coupled plasma chamber the RF is coupled into the plasma largely via capacitive discharge through RF active surface such as a shower head or a cathode.

FIG. 1a depicts an example of an inductive-coupled plasma chamber which may be used, e.g., for etching a wafer in semiconductor fabrication. In this example the coils 105 are provided over the roof section 115 of the chamber, although in other variations the coils may be provided about the sidewall 120. To couple RF energy from the RF source 110, the roof section 115 is typically made of a dielectric material having high electrical resistivity, which allows effective RF energy penetration and coupling. The RF source 110' is connected to cathode to provide the bias power. Gas injection is then provided by means of injectors 125 provided from the side of the chamber, or the center portion of the insulator roof 125', or below from bottom of the chamber. FIG. 1b illustrates a typical capacitive-coupled plasma chamber. RF energy from the RF source is applied to either top electrode assembly 145 (includes top electrode 140 and temp control unit 141) as shown by RF source 130, or to cathode 135 as shown by RF source 130', or both. When RF is applied to the top electrode assembly 145, the cathode 135 serves as the ground for 130. Conversely, when the RF source 130' is applied to the cathode 135, the top electrode assembly 145 serves as ground for 130'. Usually 130 and 130' may have different RF frequency; in some cases, 130' may have 2 or more frequencies. In both cases, the chamber walls also serve as round. The gas injection is generally done via the roof section 145, where a gas distribution plate (shower head) 140 and temperature control unit 141 are generally used to supply process gases. Currently, the majority of showerheads are made of single or poly-crystalline doped Silicon, and thus a consumable part subjected to plasma erosion.

It has previously been proposed to use Silicon Carbide, SiC, as an excellent alternative material for making the roof or the wall section of an inductively coupled plasma chamber for its electrical properties, purity and mechanical strength. It has been suggested that the part that is interposed between the coil and the interior of the chamber, i.e., the roof when the coil is placed over the roof, and the wall, when the coil is provided on the side around the wall, should be made of sintered SiC, coated with CVD SiC. More specifically, it has been suggested that the sintered SiC be made to have a high electrical resistivity so as to allow RF coupling from the coil to generate plasma. It has been further suggested that the CVD SiC coating be made of low electrical resistivity, i.e., conductive, so that it may be grounded to remove bias currents caused by the RF coupling from the cathode. Further relevant information can be found in, for example, U.S. Pat. No. 5,904,778, and other patents cited therein, all of which are incorporated herein by reference in their entirety.

As it happen, much of the industry has adopted the capacitive-coupled plasma chamber for certain applications, such as dielectric, polysilicon and metal etch applications of semiconductor wafers. However, since the sintered/CVD SiC previously proposed has properties more befitting the inductively-coupled plasma chambers, it has not been widely used for a capacitive-coupled chambers, except for the cathode edge cover rings 147 (FIG. 1b). In fact, the properties of the prior art sintered/CVD SiC structure are opposite to those required for a roof section of a capacitive-coupled plasma chamber. For example, the prior art sintered SiC base material is of high electrical resistivity, which would significantly reduce or prevent capacitive coupling of RF energy effectively and efficiently into plasma. Moreover, there has never been a suggestion that a showerhead can be commercially manufactured and available using the integrated sintered SiC/CVD SiC process.

SUMMARY

The subject invention provides a novel gas distribution plate (showerhead) and RF active or grounding electrode combination made of low electrical resistivity bulk material coated with CVD SiC. The bulk low electrical resistivity material may be, for example, high purity graphite, Silicon Carbide (SiC), carbon-converted graphite, silicon impregnated graphite, etc. In one embodiment, high purity sintered SiC is used and is coated with CVD SiC to provide a showerhead that is suitable for use in a capacitive-coupled plasma chamber.

According to an aspect of the invention, a showerhead suitable for use in a capacitive-coupled plasma chamber is provided. The showerhead comprises a bulk part made of sintered (hot pressed) SiC having low electrical resistivity, i.e., conductive SiC. The bulk part is then coated with a CVD SiC having either low or high resistivity. Gas holes are then drilled through the bulk part and the CVD coating.

According to one aspect of the invention, the holes are drilled using a one or two step process. In the latter case, holes of a first diameter (typically 0.8 mm to 1.2 mm) are first drilled part-way through the bulk SiC part. Then a second step follows of coaxially drilling of a second hole having a diameter smaller than the first diameter (typically 0.4 mm to 0.6 mm) and extending through the CVD coating. According to an aspect of the invention, the drilling is done using an ultrasound drilling machine. According to an aspect of the invention, a solid sheet is adhered to the CVD coating prior to the drilling, and is removed once drilling is completed.

According to an aspect of the invention, a capacitive-coupled plasma chamber is provided, comprising a chamber body, a specimen holder having a first electrode positioned therein, and a roof section comprising a showerhead and a RF ring. The showerhead comprises a sintered SiC bulk part having a low electrical resistivity and a CVD SiC coating provided on an interior side (facing plasma) of the showerhead. In one aspect of the invention, the sintered SiC bulk is coupled to a ground potential of the RF power supply. According to another aspect of the invention, the sintered bulk SiC is made to have resistivity of less than approximately 0.1 ohm-cm. According to another aspect, the CVD SiC has a resistivity of anywhere from 0.01 ohm-cm to 1e8 ohm-cm.

According to an aspect of the invention, a showerhead for use in a capacitive-coupled plasma chamber is provided, comprising: a bulk layer made of a low electrical resistivity material; a CVD SiC coating provided on the lower surface of the bulk; and a plurality of gas injection holes provided through the bulk and the CVD SiC coating. According to one specific example, the bulk is made of graphite. According to another example, the bulk is made of silicon-converted graphite. According to another example, the bulk is made of sintered SiC. In one example, the bulk exhibits resistivity of less than approximately 0.1 ohm-cm. In another example, the CVD SiC coating exhibits resistivity of 0.01 ohm-cm to 1e8 ohm-cm. In yet another example, each of the gas hole comprises a first section of a first diameter and extending partial-way through the bulk and a second section of a diameter smaller than the first diameter and extending coaxially from the first section and through the CVD SiC coating.

According to another aspect of the invention, a capacitive-coupled plasma chamber is provided, comprising: a chamber body; a specimen holder provided inside the chamber body, the specimen holder having an electrode provided therein; a showerhead provided on top of the chamber body, the showerhead comprising a bulk plate made of a low electrical resistivity material; a CVD SiC coating provided on the lower surface of the bulk; and a plurality of gas injection holes provided through the bulk and the CVD SiC coating; and, an RF power source coupled to the top electrode and the showerhead. In one example the bulk of the showerhead is made of sintered SiC. According to another example the bulk exhibit resistivity of less than approximately 0.01 ohm-cm. According to yet another example the CVD SiC coating exhibit resistivity of 0.1 ohm-cm to 1e8 ohm-cm. According to another example each of the gas holes comprises a first section of a first diameter and extending partial-way through the bulk and a second section of a diameter smaller than the first diameter and extending coaxially from the first section and through the CVD SiC coating.

According to another aspect of the invention, a process for re-using a showerhead is provided wherein the showerhead comprises a bulk plate and a CVD SiC coating layer, wherein the coating layer is susceptible to plasma erosion, comprising:

a. setting the maximum allowable erosion of the CVD layer per applications;
b. installing the showerhead onto a plasma chamber;
c. executing plasma process in the plasma chamber;
d. determining whether the maximum erosion has been reached and, if so proceeding to step e, if not, circularly reverting to step c;
e. removing the showerhead from the chamber;
f. removing at least part of the remaining CVD coating layer;
g. depositing a new CVD coating layer and drilling gas holes;
h. circularly reverting to step b.

According to one example step g comprises depositing CVD SiC coating layer and drilling small diameter gas holes. According to a further aspect of the invention, a top electrode assembly for an etch chamber is provided, comprising: a ceramic showerhead; a thermal control unit provided above the showerhead; and a thermally conductive film provided in between the temperature control unit and the showerhead to enable thermally-induced relative movement between the showerhead and the temperature control unit.

According to a further aspect of the invention, the CVD layer is adhered to the bulk layer using an adhesive. The adhesive may be any suitable adhesive, for example an adhesive forming an elastomeric joint such as polymer material.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 1a and 1b schematically depict prior art plasma chambers of the inductive and capacitive type, respectively.

FIGS. 2a and 2b schematically illustrate a capacitive-coupled chamber according to an embodiment of the invention.

FIGS. 3a and 3b illustrate a partial cross-section of the showerhead/electrode 250, along line A-A shown in FIG. 2b.

FIG. 6 depicts a plasma chamber according to another embodiment of the invention.

FIG. 7 depicts the showerhead/conductive ring combination used in the embodiment of FIG. 6.

FIGS. 8a and 8b depict cross sections of the showerhead and conductive rings along line A-A shown in FIG. 7.

FIG. 9 depicts another embodiment of the invention, wherein the CVD layer is adhered to the bulk CVD.

DETAILED DESCRIPTION

Figure 4:
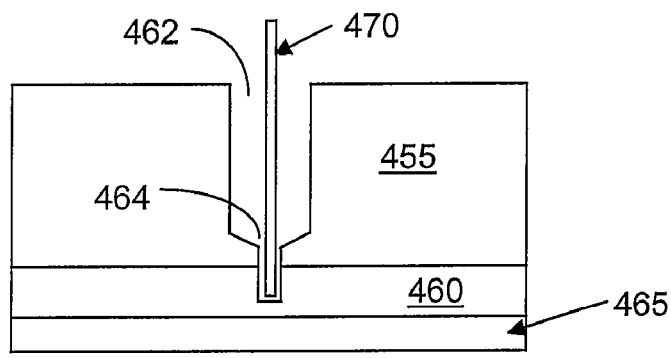
FIG. 4 depicts an embodiment for ensuring that the exit holes are clean after coaxial gas hole drilling.

FIGS. 2a and 2b schematically illustrate a capacitive-coupled chamber according to an embodiment of the invention. The chamber is somewhat similar to that shown in FIG. 1b, except that it incorporates a novel SiC showerhead as top electrode 250, a RF ring 245, and a temperature control unit 251. The showerhead/electrode 250 functions both to inject the process gases into the chamber and as a conductive electrode situated to oppose cathode 235, in this example, a cathode 237 and chuck 235 supporting a semiconductor wafer 205. The novel showerhead/RF electrode combination is made of low resistivity, i.e., conductive, bulk layer 255 coated with CVD SiC 260 (FIGS. 3a and 3b). The bulk low resistivity material may be made of, for example, graphite, Silicon Carbide (SiC), converted graphite, SiC+C, etc. In this particular example, the bulk layer is made of high purity low electrical resistivity hot pressed, or sintered, SiC.

When the bulk material would potentially come in contact with gases flowing into the chamber, it is recommended to use high purity sintered SiC or silicon impregnated graphite. For example, in places where gas injection holes are drilled through the bulk, it is recommended to use high purity sintered SiC or silicon impregnated graphite. In applications where the bulk will not come in contact with gases the selection of bulk material is more lenient. The following table provides examples for selection of suitable materials for the appropriate applications.

|  | Recommended Base Materials | Surface Material | Example | RF |
|---|---|---|---|---|
| Contact with Flow Gases | High purity low resistivity Sintered SiC, | CVD SiC | Gas Distribution Plate | Hot or Grounded |
| No Contact with Gases | High purity Graphite, Converted Graphite, Si-impregnated graphite, High Purity Sintered SiC | CVD SiC | RF Active or Grounding Ring | Hot or Grounded |

FIGS. 3a and 3b illustrate a partial cross-section of the showerhead/electrode 250, along line A-A shown in FIG. 2b. As illustrated in FIGS. 3a and 3b, in this particular example the showerhead comprises a sintered SiC bulk layer 255, and a CVD SiC coating layer 260. According to aspects of this invention, the bulk sintered SiC layer 255 comprises a low electrical resistivity SiC bulk. According to some embodiments, the resistivity of the sintered SiC layer 255 is below 10 ohm-cm and has a thickness of about 6~10 mm. According to other embodiments of the invention, the bulk layer 255 comprises high purity, low resistivity hot press SiC, having resistivity of less than 0.05 ohm-cm; however, the bulk may be made using other material having low resistivity of less than about 10 ohm-cm. In this manner, the showerhead 250 can also function as an electrode to couple the RF energy to the plasma chamber more efficiently. In this particular example, the showerhead 250 is grounded, and the hot RF output of the RF source 230 is fed to the counter-electrode 237. However, it should be understood that the opposite can also be done, i.e., the hot RF output can be coupled to the showerhead, while the counter electrode 237 is RF hot or grounded.

The CVD layer 260 may be formed using any known CVD technique and, for the purpose of this embodiment may be either conductive or insulative. Notably, unlike the prior art using sintered SiC of high resistivity, here since the bulk is made of low resistivity material, the CVD SiC may be either conductive or insulative. In this specific example, the CVD SiC layer 260 has low resistivity and has a thickness of about 2 mm. According to other embodiments, CVD layer 260 comprises β type cubic CVD SiC with doping to control the resistivity. In such an embodiment, the resistivity can be kept at about 1~100 ohm-cm. Another option for low resistivity CVD layer 260 is α type CVD SiC. The α type CVD SiC has a more amorphous structure, i.e., the crystal structure is more random, which allows the electrons to more freely go through the material so that the material is more conductive. On the other hand, if high resistivity is desired, one may use intrinsic CVD SiC of β type, generally exhibiting high resistivity of about 1e4~5 ohm-cm.

In order to form the holes for the gas injection, in the embodiment of FIG. 3b a first hole 262 is drilled partial way through the bulk 255 using ultrasonic drilling. Then a second hole 264, having a smaller diameter than the first hole 262, is drilled also using ultrasonic drilling. In this embodiment, both holes are drilled from the upper side, so that they are "self aligned." This proposed drilling process avoids having holes of small diameter and time-consuming high aspect ratio drilling. Of course, the showerhead may be made by drilling the holes in one pass of a single diameter or drilling holes from both directions, i.e., from the CVD and the bulk sides, as illustrated by FIG. 3a.

When drilling the hole through the CVD layer 260, it is important to have a "clean" exit hole without any cracks or chips. FIG. 4 depicts an embodiment for ensuring that the exit holes are clean. As shown in FIG. 4, the drilling of the first hole 462 through the bulk layer 455 has been completed, and the smaller diameter hole 464 is being drilled. To avoid chipping at the exit interface 460, a plate 465 is adhered to the CVD layer 460. The drilling is continued partially into the plate 465. Once the drilling of all of the holes is completed, the plate 465 is removed.

According to an aspect of the invention, a novel process is used in order to recycle and reuse the showerhead produced according to embodiments of the invention. That is, in certain plasma processes, such as plasma etch with fluorine gas species, the SiC would be consumed by the fluorine or oxygen in the plasma. A similar phenomenon occurs in the conventional plasma chambers having a conventional silicon showerhead. This phenomenon is generally referred to as plasma erosion. In the prior art, once the silicon showerhead has been consumed to a predetermined extent, the showerhead is discarded and is replaced by a new one. However, according to the novel process of the invention, the showerhead does not have to be discarded and may be reused to achieve substantial cost saving.

Figure 5:
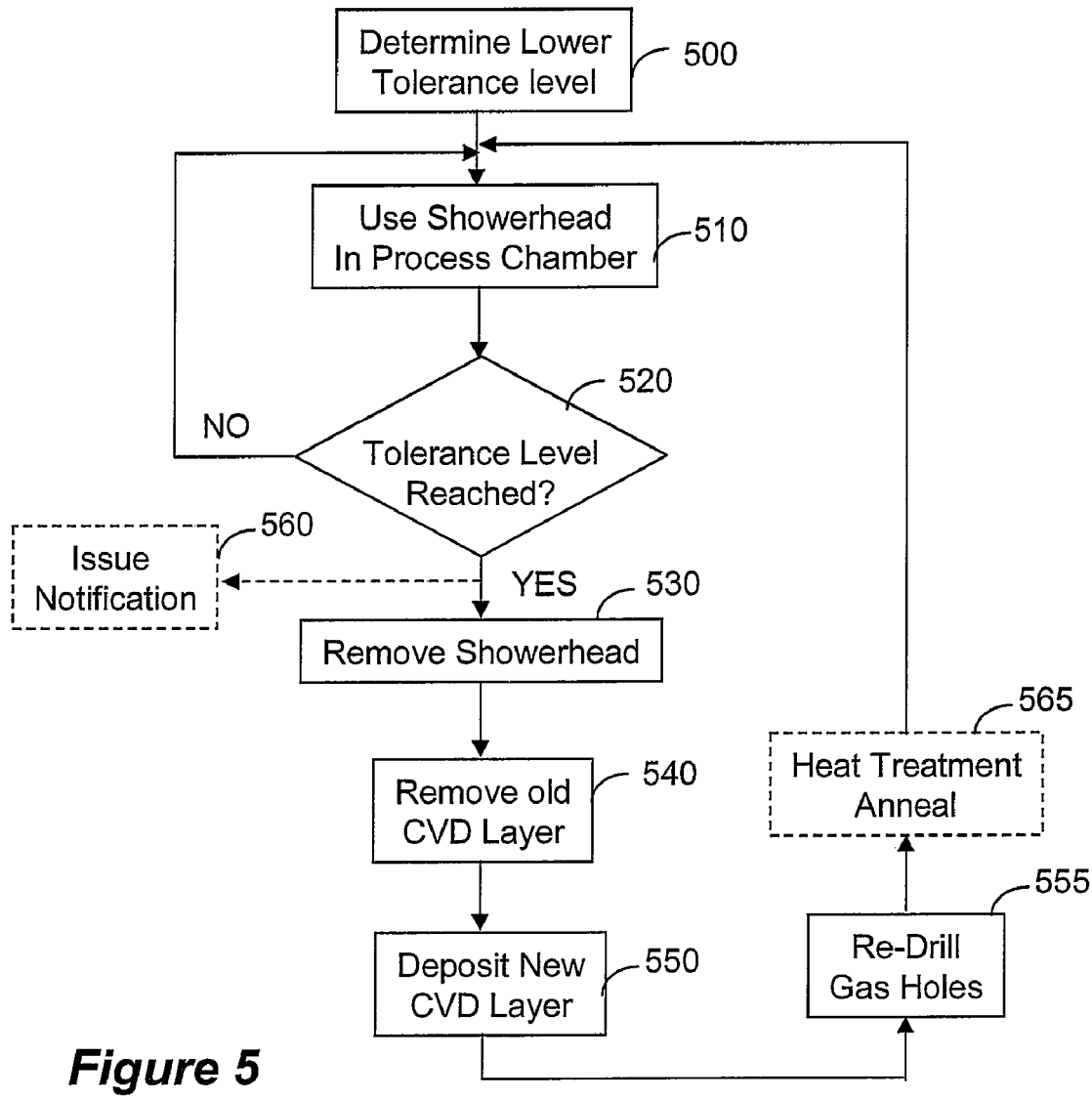
FIG. 5 is a flow chart illustrating a process according to an embodiment of the invention.

FIG. 5 is a flow chart illustrating a process according to an embodiment of the invention. As shown in FIG. 5, in step 500 a lower tolerance is determined. The lower tolerance means the maximum thickness of the CVD layer that may be consumed by plasma erosion before the showerhead must be removed from the chamber. According to one embodiment, the lower tolerance is set to 0.5 mm coating remaining on the showerhead. The showerhead is then installed in the chamber and is used in plasma processing (Step 510). At Step 520 it is determined whether the tolerance level has been reached. This may be done, for example, by measuring beforehand the rate of CVD consumption by the average plasma erosion rate or plasma RF hours, determining the amount of CVD layer that may be consumed before the tolerance level has been reached, and timing the usage of the showerhead to determine a stopping point. Other methods may include simply timing the plasma hours and determining a pre-set plasma hours periods upon which the showerhead should be resurfaced. Alternatively, or in addition, the plasma process can be monitored for process drift caused by changes in the showerhead surface structure. Once the tolerance level has been reached, the showerhead is removed at Step 530. Then, at least part of the remaining CVD coating is removed in step 540 and in Step 550 a new CVD SiC layer is deposited on the bulk layer followed by the gas hole drilling in step 555 (in this case, in the CVD layer only). The showerhead is then re-installed in a chamber and reused.

On the other hand, the inventors have observed that although the bulk layer (i.e., layer 255 in FIGS. 3a and 3b) may be of sintered material, the showerhead emits particles upon initial use after installation. Upon investigation the inventors have determined that the particles result from the drilling operation. That is, the drilling operation damages the surface of the bulk and/or CVD layers at the drilled hole. Accordingly, a novel processing has been tested whereby the showerhead is re-heated or annealed after drilling. For example, in one test the showerhead was annealed after drilling at about 2000° C. This heat treatment proved beneficial and may be used upon initial construction of the showerhead and/or after each re-deposition of the CVD SiC layer. In FIG. 5 this is exemplified by optional heat treatment or anneal step 565.

FIG. 6 depicts a plasma chamber according to another embodiment of the invention. FIG. 7 depicts the showerhead 650, the conductive-ring 670 (for RF active or grounding purpose), and a temperature control unit (TCU) 610 combination used in the embodiment of FIG. 6. FIGS. 8a and 8b depict cross sections of the showerhead and the conductive ring along line A-A shown in FIG. 7. The plasma chamber illustrated in FIG. 6 is very similar to that illustrated in FIG. 2, except that a conductive ring 670 is used in combination to the showerhead 650. As is shown in FIG. 7, the showerhead 650 has gas holes much in the same manner as that shown in FIG. 2b. The showerhead 650 is nested and coaxial with the conductive ring 670, which has no gas holes. As shown in FIG. 8b, the construction of the showerhead is similar to that of FIG. 3; however, the construction of the conductive ring 670 is different. That is, as shown in FIG. 8a, the conductive ring 670 has no gas holes. Additionally, in this embodiment the conductive ring is made of a conductive bulk layer 655' and a CVD coating layer 660'. In this specific embodiment, the bulk layer 655' is made of graphite, while the CVD layer 660' is made of CVD SiC. While in this specific embodiment it appears that the conductive ring 670 and the showerhead 650 are of the same thickness, this is not necessarily so.

FIG. 6 also depicts a controller 680 that is used to control the operation of the plasma chamber. Controller 680 may be a tailor-made machine or may be a general purpose computer, such as a PC, programmed to execute operations to control the plasma chamber. According to one feature of the invention, the computer is programmed with the value of the minimum tolerance. According to one embodiment, this is done in terms of operation time, i.e., the amount of time the RF power generator 630 is energized. As can be understood, this can be calculated by determining the plasma erosion rate of the CVD layer, as explained with respect to FIG. 5. The controller resets a counter each time a new showerhead is installed. The counter is run whenever the RF generator 630 is energized. Then, when the minimum tolerance level is reached, e.g., the RF hours have been reached; the controller issues a notification to the operator that the showerhead needs to be removed from the plasma chamber, as shown in the optional step 560 of FIG. 5.

In this embodiment, the conductive ring enhances coupling of RF to the electrical potential, in this case, grounded potential. Accordingly, the bulk 655' of the conductive ring 670 is made of a material that is more conductive than the bulk 655 of the showerhead 650. As can be understood, in circumstances where the conductive ring is exposed to the plasma and undergoes plasma processing, the same reuse process described in respect to FIG. 5 can be used to recycle the conductive ring.

To achieve etch consistency, it is necessary to control and maintain a stable shower head and conductive ring surface temperature during plasma etch process. In the embodiment of FIG. 6, a thermal control unit, TCU 610, sits directly above the shower head 650 and the conductive ring 670. However, while the TCU 610 is made of metallic material, the showerhead 650 is made of ceramic, which has a different thermal expansion coefficient than the metal. A feature of the invention is to have an optional thermally conductive but electrically insulative layer 615 between the TCU 610 and showerhead 650 and conductive ring 670. This conductive layer, typically 10-30 um thick, in this example, can be a Teflon® or Kapton® layer or similar film which is thermally conductive and allows relative motion between TCU 610 and showerhead 650 and conductive ring 670 due to temperature fluctuations. Teflon and Kapton are registered trademark of E. I. du Pont de Nemours and Company of Wilmington, Del. In the example of FIG. 6, the layer is simply sprayed on the bottom surface of the TCU 610.

FIG. 9 depicts another embodiment of the invention, wherein the CVD layer is adhered to the bulk CVD. More specifically, FIG. 9 depicts a cross section of a showerhead that may be used in any of the above-described embodiments, such as showerhead 250 of FIG. 2b or showerhead 650 of FIG. 7. The showerhead shown in FIG. 9 has a CVD SiC layer 960 that is adhered to bulk SiC 955 via adhesive 995. The adhesive may be any suitable adhesive, for example an adhesive forming an elastomeric joint such as polymer material. Specific examples of materials that may be used include polyimide, polyketone, polyetherketone, polyether sulfone, polyethylene terephthalate, fluoroethylene propylene copolymers, cellulose, triacetates, silicone, and rubber. Examples of high purity elastomeric materials which may be used include one-component room temperature curing adhesives available from General Electric as RTV 133 and RTV 167, a one-component flowable heat-curable (e.g. over 100° C.) adhesive available from General Electric as TSE 3221, and a two-part addition cure elastomer available from Dow Corning as "SILASTIC." An especially suitable elastomer is a polydimethylsiloxane containing elastomer such as a catalyst cured, e.g. Pt-cured, elastomer available from Rhodia as V217, an elastomer stable at temperatures of 250° C. and higher. The elastomer material can optionally include a filler of electrically and/or thermally conductive particles or other shaped filler such as wire mesh, woven or non-woven conductive fabric, etc.

The embodiment shown in FIG. 9 illustrates the gas injection holes of two diameter holes as shown in FIG. 3b, however a single diameter hole such as shown in FIG. 3a may also be used. Also, when using this embodiment, the process of FIG. 5 is modified in that in Step 540 the action of removing the old CVD layer includes the action of removing the old adhesive layer. Additionally, Step 550 is modified to designate the action of adhering new CVD layer, rather than depositing new CVD layer.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the plasma chamber arts. It is intended that the specification and examples be considered as exemplary only, with a true scope and spirit of the invention being indicated by the following claims.

The invention claimed is:

1. A showerhead for use in a capacitive-coupled plasma chamber, comprising: an electrically conductive ring; a plate nested within, touching, and coaxial with the conductive ring and comprising bulk layer made of a low electrical resistivity material; a CVD SiC coating provided on the lower surface of the bulk layer and on lower surface of the conductive ring; a plurality of gas injection holes provided through the bulk layer and the CVD SiC coating.

2. The showerhead of claim 1, wherein said bulk layer is made of graphite.

3. The showerhead of claim 1, wherein said bulk layer is made of converted SiC from graphite.

4. The showerhead of claim 1, wherein said bulk layer is made of sintered SiC or hot pressed SiC.

5. The showerhead of claim 1, wherein said bulk layer exhibit resistivity of less than approximately 10 ohm-cm.

6. The showerhead of claim 4, wherein said CVD SiC coating exhibit resistivity of 0.1 ohm-cm to 1e8 ohm-cm.

7. The showerhead of claim 1, wherein each of said plurality of gas holes comprises a first section of a first diameter and extending partial-way through the bulk layer and a second section of a diameter smaller than the first diameter and extending coaxially from the first section and through the CVD SiC coating.

8. The showerhead of claim 1, wherein said gas injection holes are made by drilling holes through the bulk layer and the CVD coating layer, and then annealing the showerhead after the drilling.

9. The showerhead of claim 1, further comprising an adhesive provided between the bulk layer and the CVD coating.

10. The showerhead of claim 1, wherein the conductive ring is made of graphite.

11. The showerhead of claim 1, wherein the conductive ring is made of material that is more conductive than the bulk layer.

* * * * *